(12) United States Patent
Kamo

(10) Patent No.: US 7,495,308 B2
(45) Date of Patent: Feb. 24, 2009

(54) SEMICONDUCTOR DEVICE WITH TRENCH ISOLATION

(75) Inventor: Ryuichi Kamo, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 172 days.

(21) Appl. No.: 11/391,301

(22) Filed: Mar. 29, 2006

(65) Prior Publication Data

US 2006/0220017 A1 Oct. 5, 2006

(30) Foreign Application Priority Data

Mar. 30, 2005 (JP) .............................. 2005-099584

(51) Int. Cl.
*H01L 27/10* (2006.01)
(52) U.S. Cl. ...................... 257/510; 257/513
(58) Field of Classification Search ................. 257/524, 257/E29.02, 510, 513
See application file for complete search history.

(56) References Cited

U.S. PATENT DOCUMENTS

2005/0156238 A1* 7/2005 Wen et al. ................... 257/347

FOREIGN PATENT DOCUMENTS

JP 2004-356428 12/2004

\* cited by examiner

*Primary Examiner*—Allan R. Wilson
(74) *Attorney, Agent, or Firm*—Oblon, Spivak, McClelland, Maier & Neustadt, P.C.

(57) ABSTRACT

A semiconductor device includes a semiconductor substrate including a plurality of trenches formed along a first direction and a plurality of first upper surfaces divided by the trenches, a plurality of element isolation insulating films embedded in the respective trenches and including a plurality of second upper surfaces continuous with the first upper surfaces in a second direction which is perpendicular to the first direction, respectively, a plurality of interlayer insulating films formed above the first and the second upper surfaces, and a plurality of contact plugs defined in the interlayer insulating films so as to connect with the first upper surfaces of the semiconductor substrate. Each first upper surface is inclined in the second direction so as to be lowered from a central part toward interfaces between each first upper surface and the second upper surfaces adjacent to each first upper surface.

8 Claims, 10 Drawing Sheets

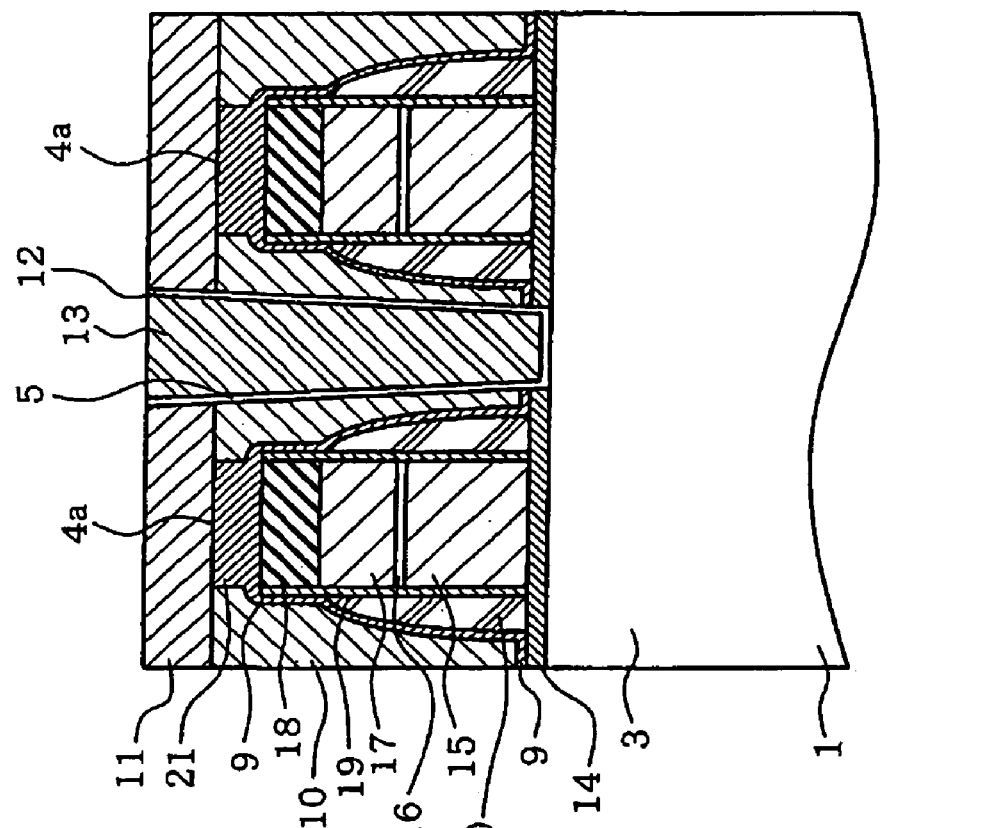
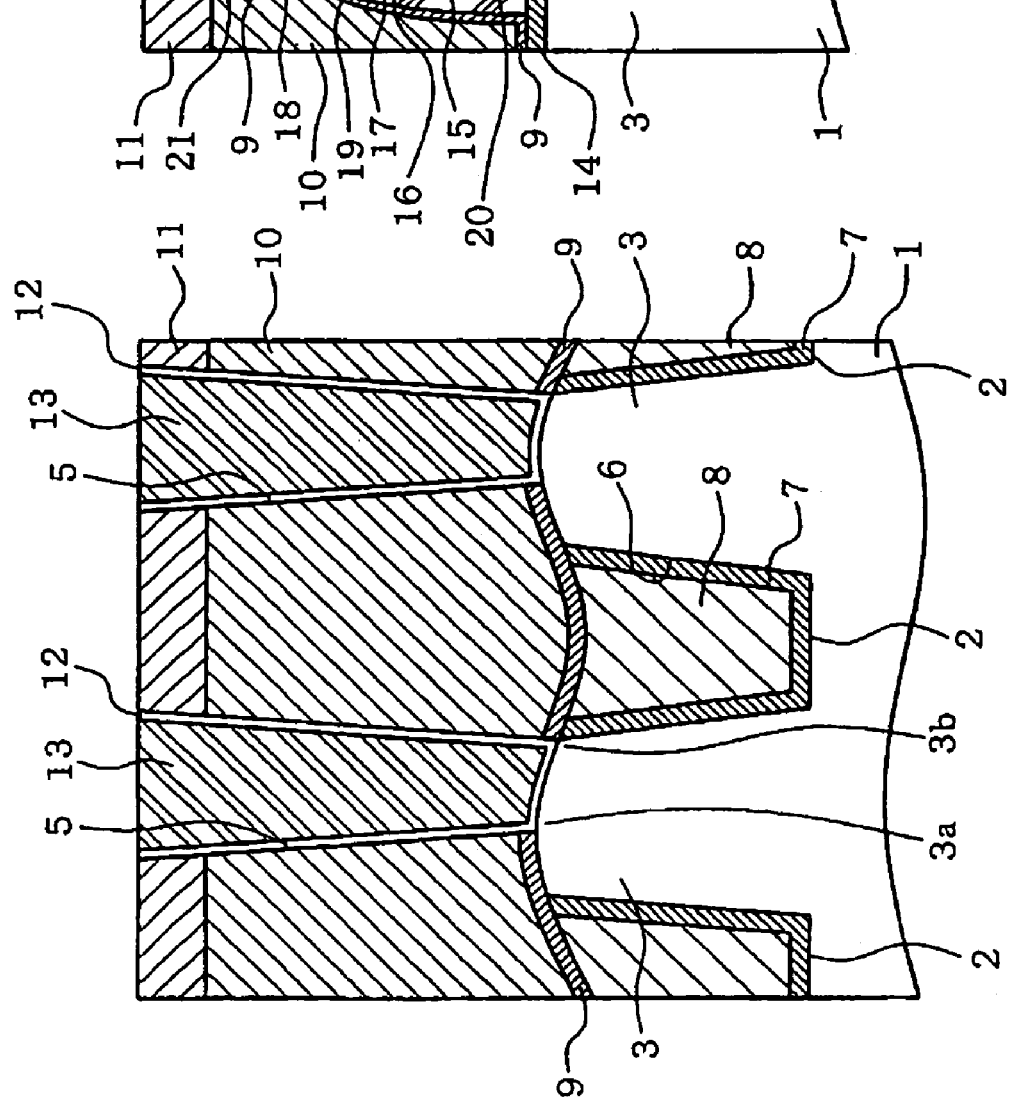
FIG. 1A
FIG. 1B

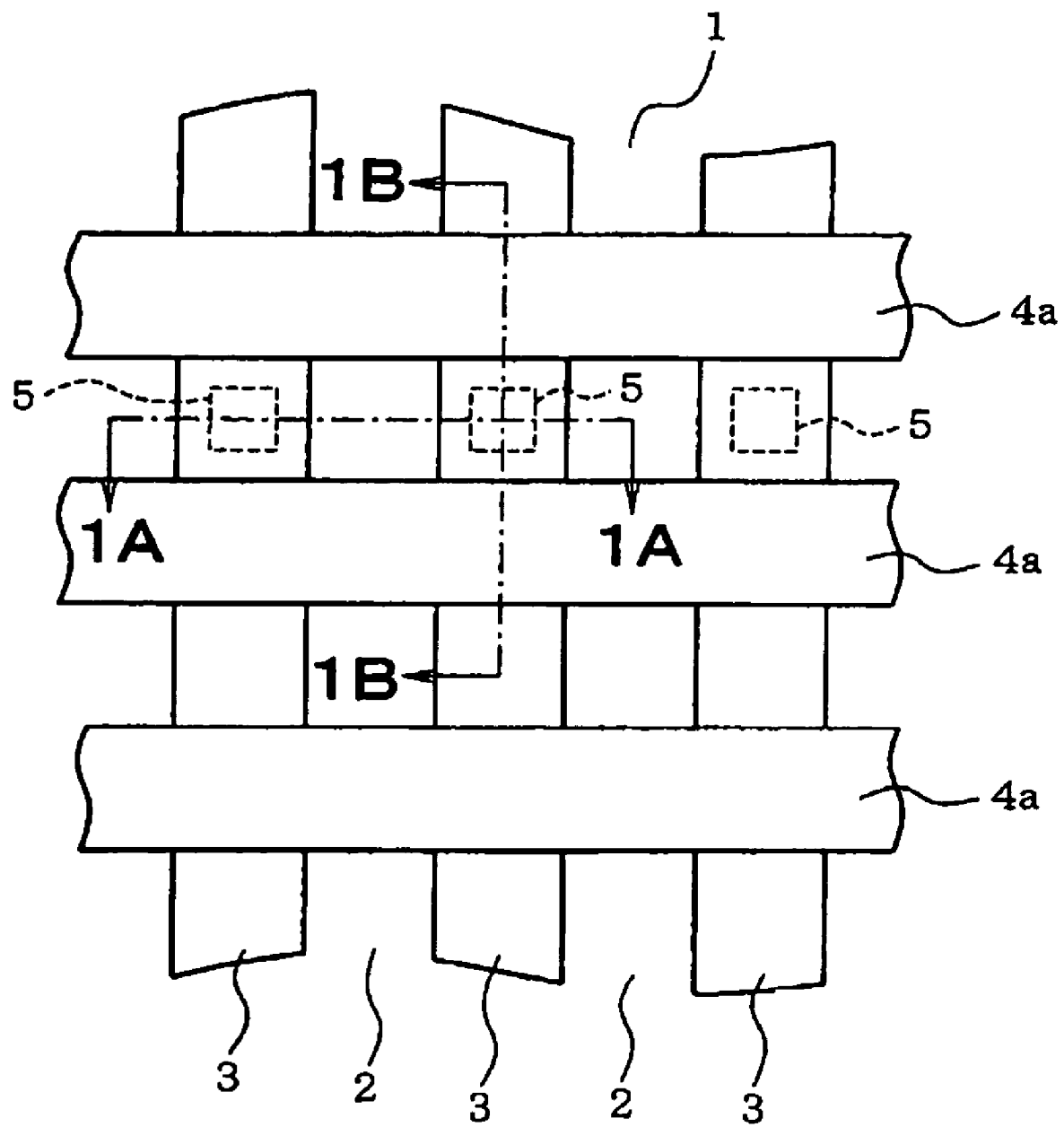

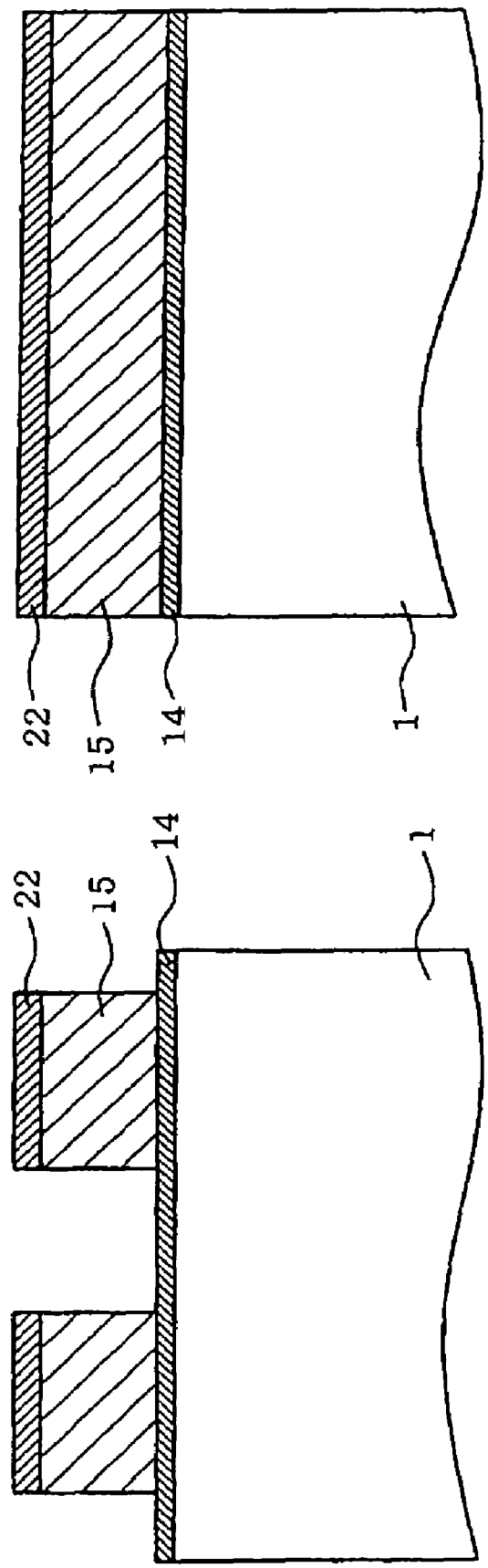

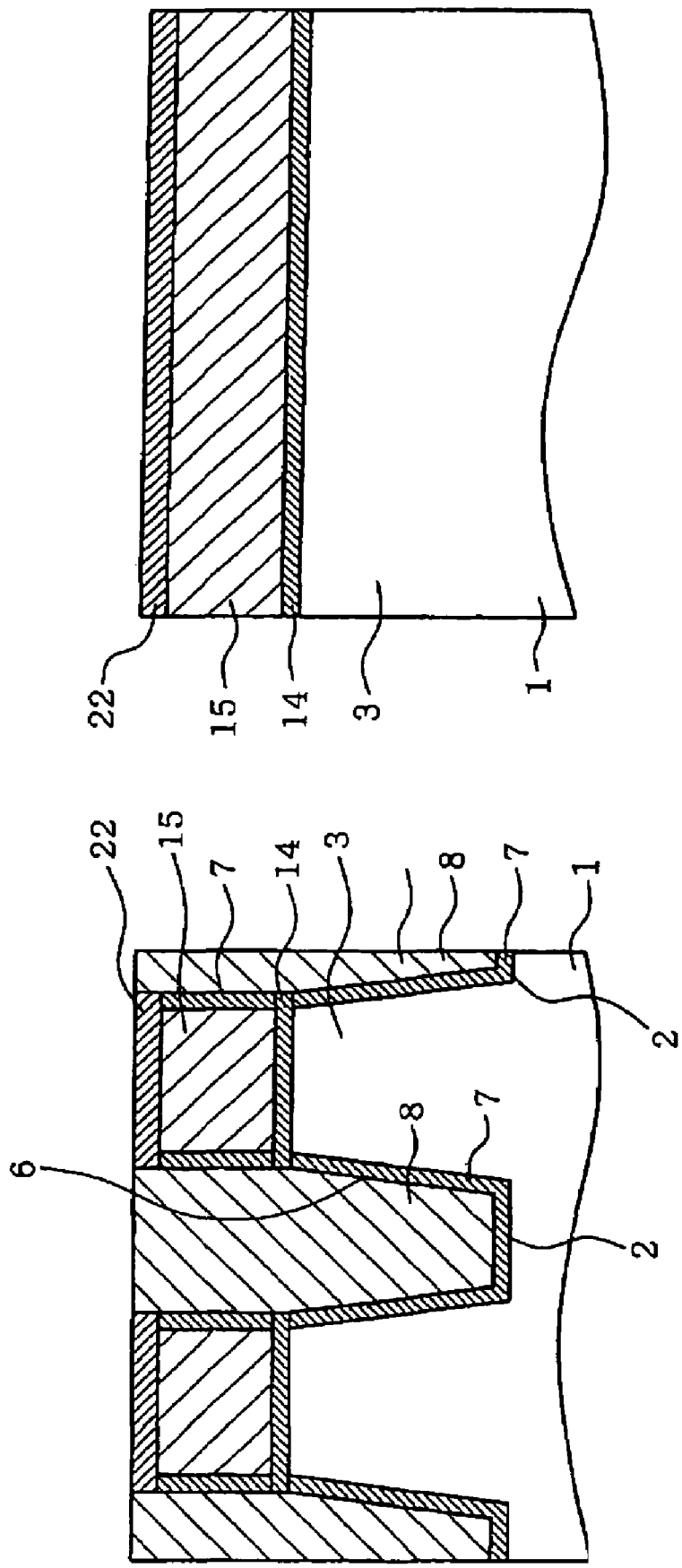

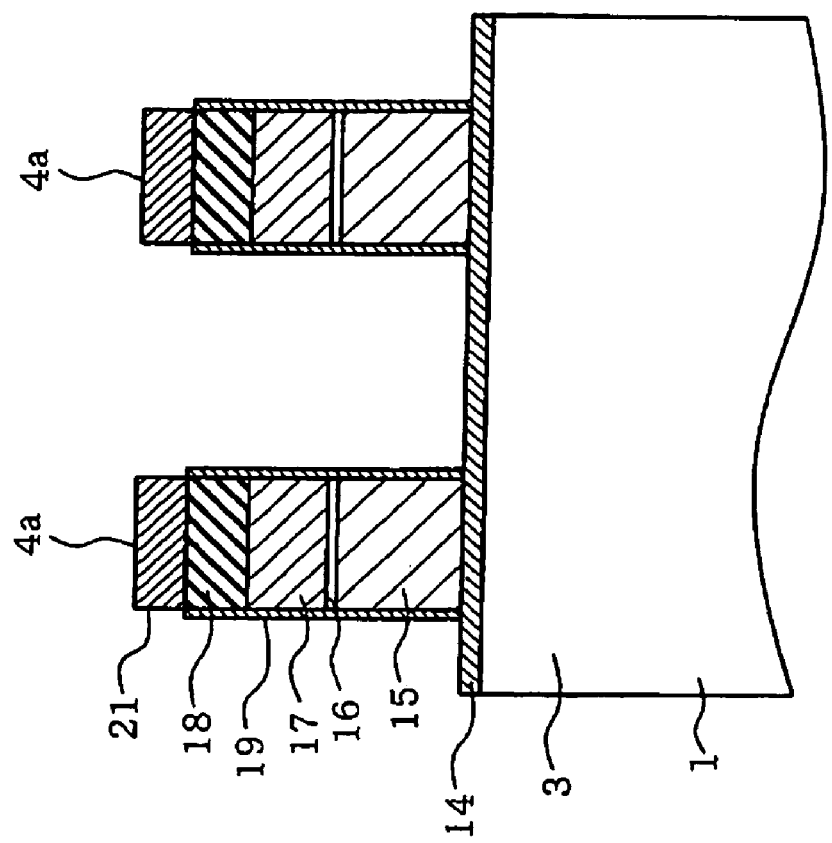
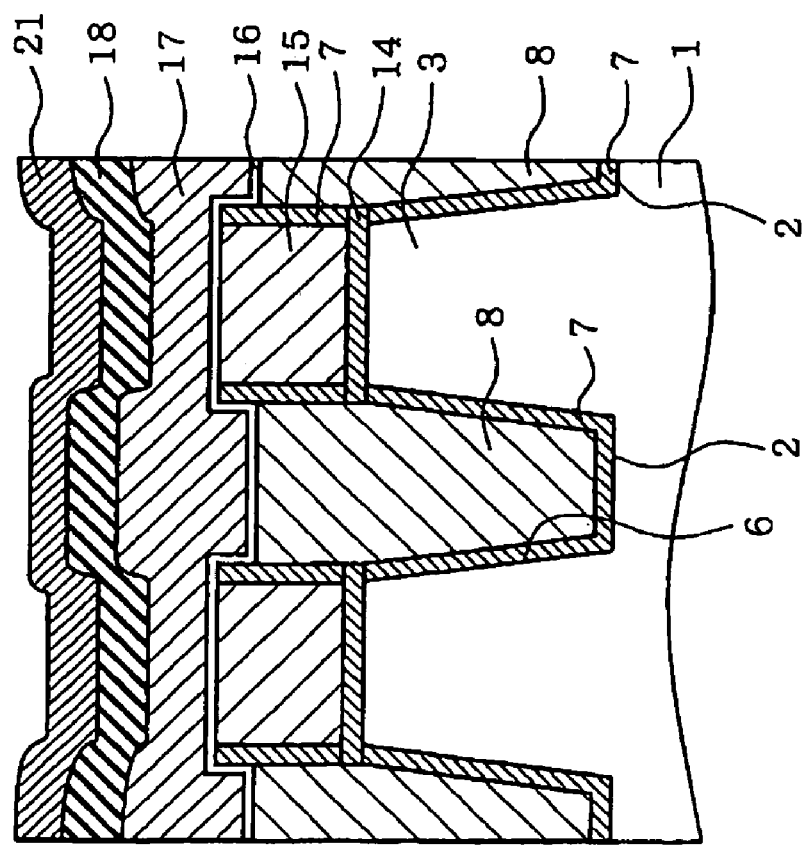

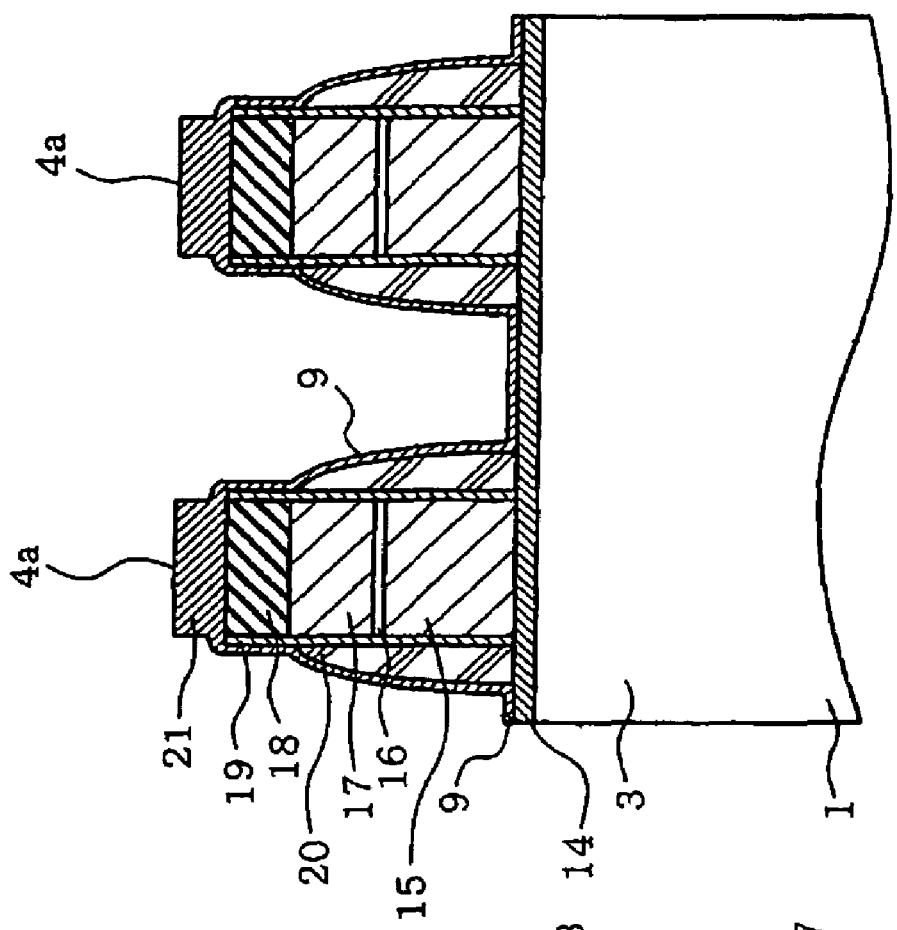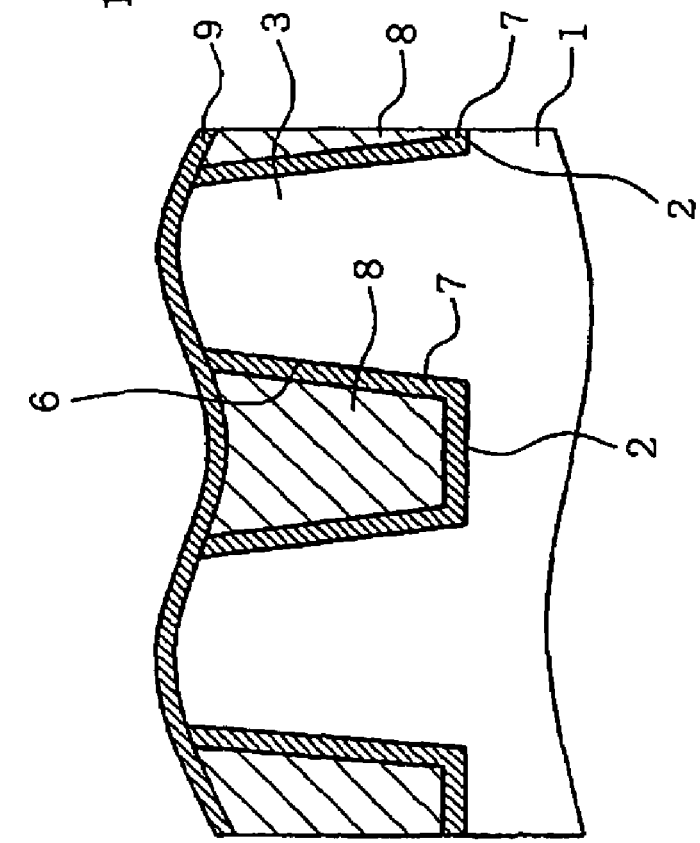

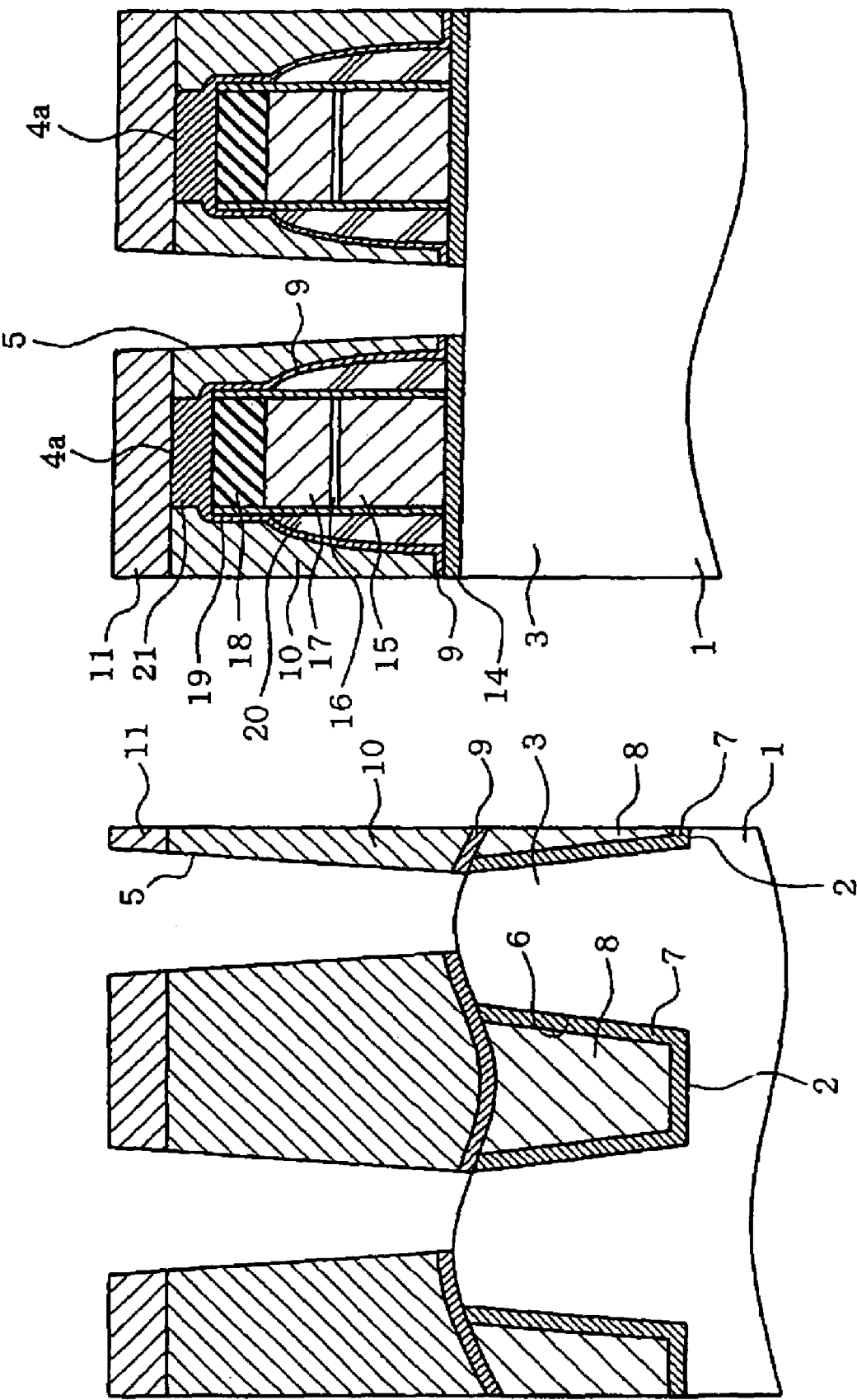

SEMICONDUCTOR DEVICE WITH TRENCH ISOLATION

CROSS-REFERENCE TO RELATED APPLICATIONS

This application is based upon and claims the benefit of priority from the prior Japanese Patent Application No. 2005-99584, filed on Mar. 30, 2005, the entire contents of which are incorporated herein by reference.

BACKGROUND OF THE INVENTION

1. Field of the Invention

The present invention relates to a semiconductor device which is configured to form an element isolation region on a semiconductor substrate thereby to provide an element forming region and a method of manufacturing the same.

2. Description of the Related Art

Flash memories have conventionally been known as one of semiconductor devices of the above-mentioned type. In the flash memories, a shallow trench isolation (STI) is formed on a semiconductor substrate so that an active area is separately formed. Transistors are formed in the active area. JP-A-2004-356428 discloses one of such techniques. In the disclosed technique, an STI is formed as follows. Firstly, a silicon oxide film, a polycrystalline silicon film and a silicon nitride film are sequentially formed on the silicon substrate. These films are etched by a photolithography process into a predetermined pattern. A trench is formed in the silicon substrate. A silicon oxide film is buried in the trench, whereby an STI is formed in the silicon substrate and a surface of the silicon substrate is divided into element forming areas.

A planarization process is carried out by a chemical mechanical polishing (CMP) method. Furthermore, a level of the silicon oxide film buried in the STI is adjusted by a reactive ion etching (RIE) method and subsequently, a silicon nitride film is removed. Thereafter, an oxide-nitride-oxide (ONO) film for forming a control gate, a polycrystalline silicon film, a tungsten silicide (WSi) film and a silicon nitride film are sequentially formed, and a silicon oxide film is formed. Successively, the silicon oxide film, silicon nitride film, WSi film, polycrystalline silicon film and ONO film are sequentially etched by a photolithography process in the RIE method, so that a gate electrode is formed.

Subsequently, a silicon oxide film is formed on a sidewall of the gate electrode. Furthermore, another silicon oxide film is formed and etched. A silicon nitride film is then formed on the etched silicon oxide film. Thereafter, a silicon oxide film is again formed and a planarization process is carried out by the CMP method. Successively, a silicon oxide film is formed and a mask is formed by the photolithography process. Contact holes are formed and conductors are buried in the contact holes.

In case position gap of the pattern occurs in forming contact holes, an area of a part of the contact hole opposed to the element forming area of the silicon substrate is reduced such that a part of the conductor in the contact hole coming into contact with the element forming area is also reduced, whereupon the contact resistance is increased.

The aforesaid phenomenon necessarily occurs in the process which assumes a position gap of the pattern. The increase in the contact resistance is so small that the increase can be ignored in view of the degree of refinement. However, a recent reduction in the design rules has increased the contact resistance, thereby ill-affecting the characteristics of the elements. Such an increase in the contact resistance renders the writing time longer in an electrical writing operation, decreasing the functions of the elements.

SUMMARY OF THE INVENTION

Therefore, an object of the present invention is to provide a semiconductor device in which an increase in the contact resistance can be prevented even when a position gap of the pattern occurs in the photolithography process for a part of the element forming area in which a connecting hole is formed in the insulating film.

In one aspect, the invention provides a semiconductor device comprising a semiconductor substrate including a plurality of trenches formed along a first direction and a plurality of first upper surfaces divided by the trenches, a plurality of element isolation insulating films embedded in the respective trenches and including a plurality of second upper surfaces continuous with the first upper surfaces in a second direction which is perpendicular to the first direction, respectively, a plurality of interlayer insulating films formed above the first and the second upper surfaces, and a plurality of contact plugs defined in the interlayer insulating films so as to connect with the first upper surfaces of the semiconductor substrate. Each first upper surface is inclined in the second direction so as to be lowered from a central part thereof toward interfaces between said each first upper surface and the second upper surfaces adjacent to said each first upper surface.

In another aspect, the invention provides a method of manufacturing a semiconductor device, comprising forming a trench in a semiconductor substrate and burying an element isolation insulating film in the trench, thereby forming an element isolation region, forming a gate electrode in an element forming area isolated by the element isolation region, etching the element forming area so that a surface thereof is inclined so as to be lowered from a central part thereof toward an interface between the element isolation region and the element forming area, forming an interlayer insulating film, forming a connecting hole, and burying an electrode material in the connecting hole, thereby forming an electrode.

BRIEF DESCRIPTION OF THE DRAWINGS

Other objects, features and advantages of the present invention will become clear upon reviewing the following description of the embodiment with reference to the accompanying drawings, in which:

FIGS. 1A and 1B are schematic sectional views of a semiconductor device in accordance with a first embodiment of the present invention;

FIG. 2 is a schematic plan view of the semiconductor device; and

FIGS. 3A to 10B are sectional views of portions of the semiconductor device corresponding to stages of manufacturing process respectively.

DETAILED DESCRIPTION OF THE INVENTION

Figure 5B:
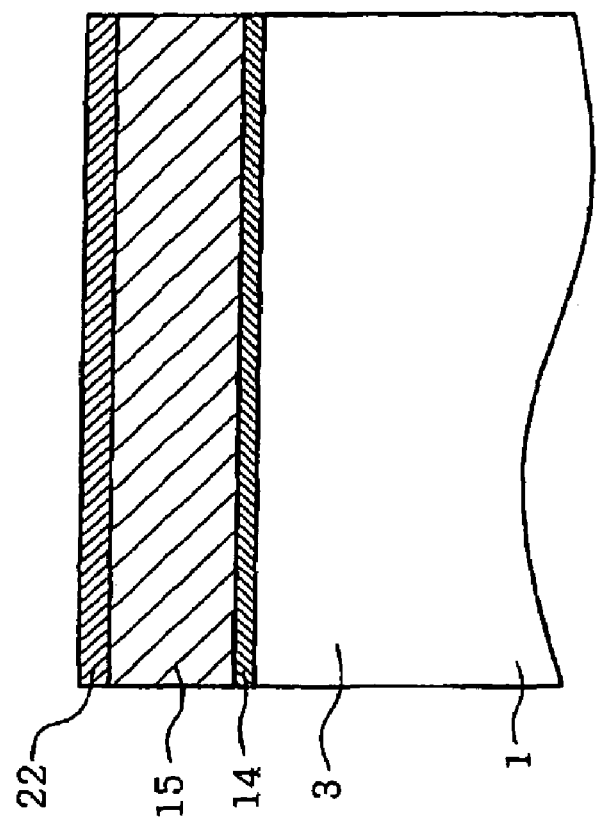

One embodiment of the present invention will be described with reference to the accompanying drawings. FIGS. 1A and 1B schematically show a sectional structure of a memory cell region of a flash memory. FIG. 2 is a plan view of the memory cell region. Referring to FIG. 2, the flash memory comprises a silicon substrate 1 serving as a semiconductor substrate in which a shallow trench isolation (STI) 2 serving as an element isolation region is formed. A surface of the silicon substrate 1 is isolated into strips by the STI 12, whereby an active area (AA) 3 serving as an element forming area is formed.

Gate electrodes 4 are formed on the STI 2 and an upper part of the active area 3 at predetermined intervals so as to extend perpendicularly to the STI 2 and the active area 3. Each gate electrode 4 includes an upper strip-shaped portion which functions as a control gate. This portion is formed so as to correspond to a part of the control gate intersecting the active area 3 located at a lower layer of the control gate. This portion functions as a floating gate.

In the figures, what is shown as the gate electrode 4a serves as a select gate. Transistors in this portion are provided as select transistors and accordingly, no floating gate is provided. Contact holes 5 are formed in interlayer insulating films (not shown) so as to be located between the selective gates 4a of the active area 3. Each contact hole 5 provides electrical contact between the selective gates 4a.

FIG. 1A is a view taken along line 1A-1A extending across the active area 3 formed with the contact hole 5 in FIG. 2. FIG. 1B is a view taken along line 1B-1B extending across the gate electrodes 4a in FIG. 2. The surface of the silicon substrate 1 is etched down to a predetermined depth, whereby a trench 6 is formed. The trench 6 has an inner wall on which a thin silicon oxide film 7 is formed. A silicon oxide film 8 is buried inside the silicon oxide film 7 of the trench 6. The silicon oxide film 8 serves as an element isolation insulating film which is a first insulating film formed by a high density plasma (HDP) method. The surface of the silicon substrate 1 is thus divided by the STI 2 configured as described above, whereby an active area 3 corresponding to an element forming region is separately formed.

In the section as shown in FIG. 1A, the active area 3 includes a part in which the contact hole 5 of the a selective transistor is formed. This part is formed into such a shape that the STI 2 and the surface of the active area 3 have a shape along an undulate curve. The surface of the active area 3 of the selective transistor has a central part 3a whose neighbor located highest and an end 3b that is adjacent to the STI 2 and is formed into an upwardly convex smooth surface so as to be lowered.

On an upper surface of the above-described configuration are formed a silicon nitride film 9, a silicon oxide film 10 and another silicon oxide film 11. The silicon nitride film 9 serves as an interlayer insulating film which is a second insulating film. Contact holes 5 are formed so as to extend through the silicon oxide films 10 and 11. The silicon nitride film 9 is formed with an opening. A barrier metal layer 12 with a small film thickness is formed in the contact hole 5. A tungsten plug 13 is buried in the contact hole 5.

Referring to FIG. 1B, the gate electrodes 4a are formed on the gate oxide so as to extend across the active area 3 on the section extending in the direction of formation of the active area 3. The gate electrodes 4a (or gate electrodes 4) is formed by stacking a polycrystalline silicon film 15, ONO film 16, another polycrystalline silicon 17 and a tungsten-sillicide (WSi) film 18 sequentially from the bottom. The polycrystalline silicon 17 is provided for forming the control gate. Since the floating gate is not required in the selective transistor, an opening may be formed in the part of the ONO film 16 so that the polycrystalline silicon films 15 and 17 are electrically conducted.

A thin silicon oxide film 19 is formed on a sidewall of the gate electrode 4a. Furthermore, a silicon oxide film 20 is formed as a spacer. A silicon nitride film 21 is formed on upper surfaces of the gate electrodes 4a. Silicon oxide films 10 and 11 are further formed so as to cover the gate electrodes 4a. A contact hole 5 is formed between the gate electrodes 4a so as to extend through the silicon oxide films 10 and 11. The aforesaid barrier metal layer 12 and the tungsten plug 13 are formed in the contact hole 5.

In the above-described arrangement, the surface of the active area 3 forming the contact hole 5 is bowed outwardly convexly. Accordingly, even when a position gap of the pattern shifts the contact hole 5 from a normal position as shown in FIG. 1, an area in contact with the contact plug 13 formed as an electrode is ensured. Consequently, an increase in the contact resistance due to the position gap of the pattern can be prevented, whereupon the semiconductor device can desirably be operated.

The manufacturing process of the foregoing arrangement will be described with reference to FIGS. 3A to 10B. Referring to FIGS. 3A and 3B, heat is firstly applied to the silicon substrate 1 in an atmosphere of moisture at 750° C., so that the silicon oxide film 14 with a film thickness of 8 nm is formed on the surface of the silicon substrate 1. A first polycrystalline silicon film 15 and a silicon nitride film 22 are deposited by a low pressure chemical vapor deposition. (LPCVD) process. The first polycrystalline silicon film 15 is added with phosphor (P) and has a film thickness of 140 nm, whereas the silicon nitride film 22 has a film thickness of 70 nm.

Subsequently, a silicon oxide film (not shown) is deposited as a mask material, and a photolithography process is carried out so that a desired pattern of photoresist is formed. Another silicon oxide film is formed as a mask material by the reactive ion etching (RIE) process. Successively, the silicon substrate 1 is exposed to $O_2$-plasma so that the photoresist is removed.

The silicon nitride film 22 is formed using a mask made from the silicon oxide film as shown in FIGS. 4A and 4B. The polycrystalline silicon film 15, the silicon oxide film 14 and the silicon substrate 1 are processed with the patterned silicon nitride film 22 serving as a mask. As a result, the trench 6 is formed in the silicon substrate 1. Next, heat is applied to the silicon substrate 1 in an atmosphere of oxygen at 1000° C. so that a silicon oxide film 7 is formed on an outer wall of the trench 6. Successively, a silicon oxide film 8 with a film thickness of 750 nm is deposited by the HDP process. The silicon oxide film 8 is then planarized by the CMP process and thereafter, heat is applied to the silicon oxide film 8 in an atmosphere of nitride at 850°C.

Figure 5A:
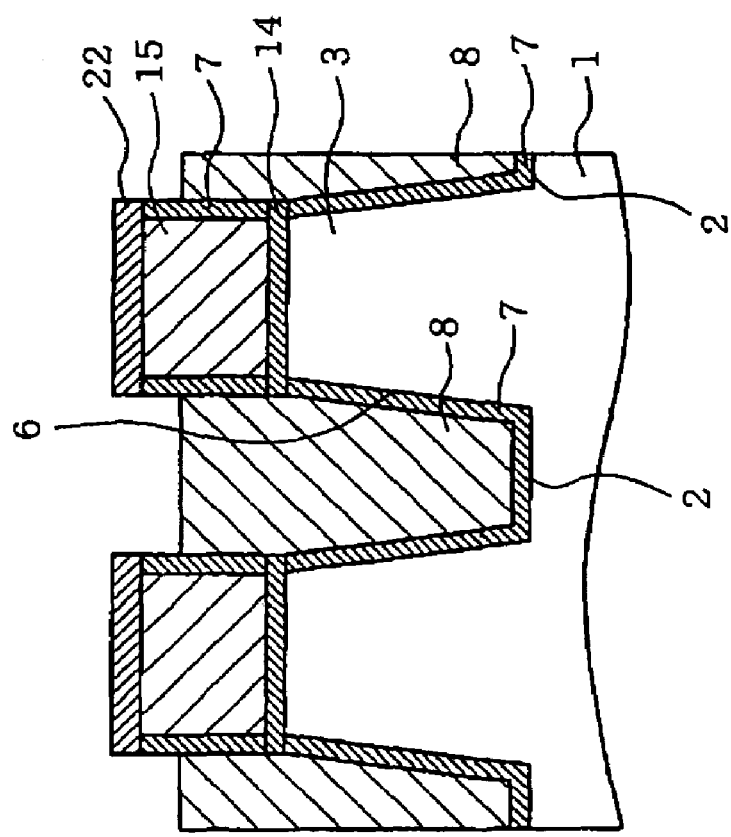
Figure 6B:
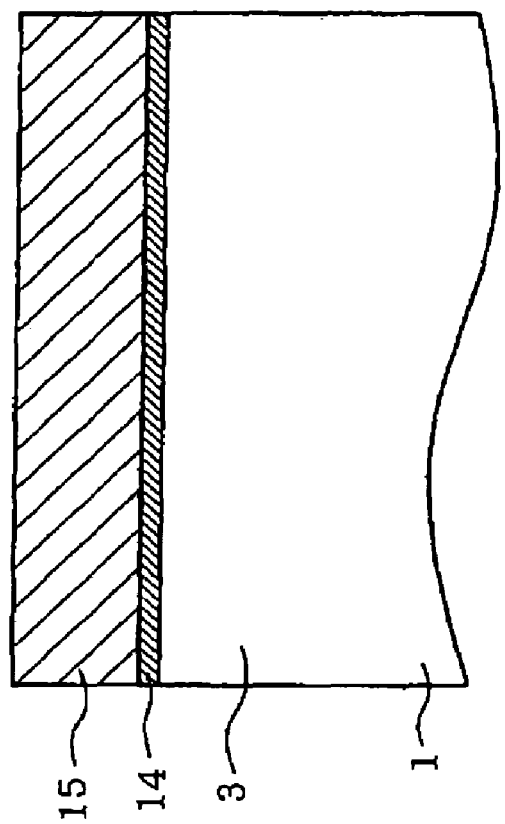
Figure 6A:
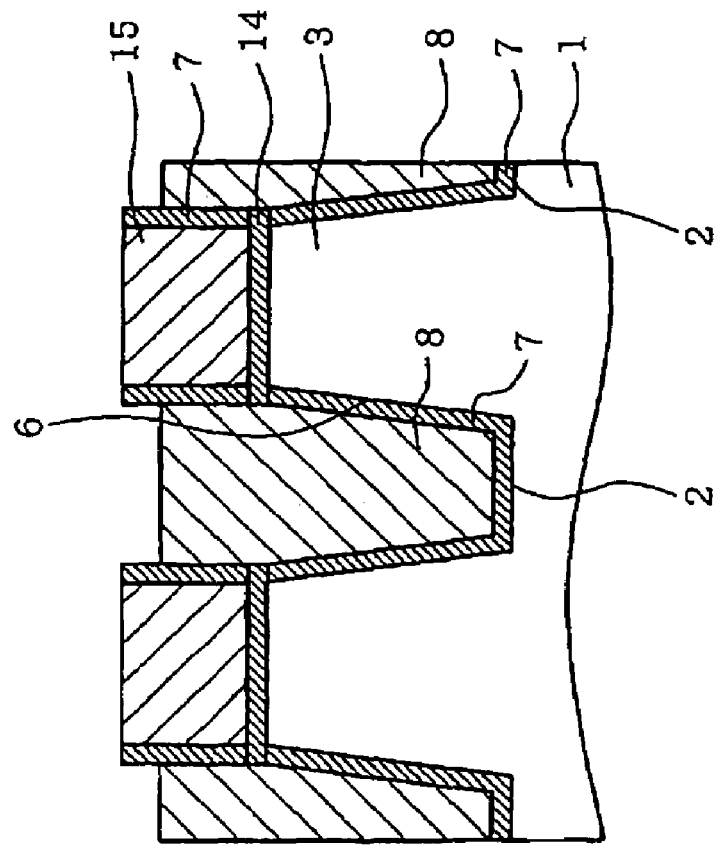

The silicon oxide film 8 is then etched by the RIE process as shown in FIGS. 5A and 5B. The silicon oxide film 8 is etched so that an upper surface thereof is located higher by a predetermined value than the surface of the silicon substrate 1. Subsequently, the silicon nitride film 22 is removed by phosphating at 150° C. as shown in FIGS. 6A and 6B.

Subsequently, the ONO film 16, the polycrystalline silicon film 17, the WSi film 18 and the silicon nitride film 21 are sequentially deposited by the LPCVD process. The ONO film 16 is a three-layer film of a silicon oxide film with a film thickness of 5.5 nm, a silicon nitride film with a film thickness of 9.5 nm and a silicon oxide film with a film thickness of 5.3 nm. The polycrystalline silicon film 17 is added with phosphor (P) and has a film thickness of 80 nm. The WSi film 18 has a film thickness of 120 nm. The silicon nitride film 21 has a film thickness of 220 nm. A silicon oxide film (not shown) serving as a mask material is then deposited. The photoresist is patterned into a desired shape by the photolithography process. The silicon oxide film is processed by the RIE process with the patterned photoresist serving as a mask. Subsequently, the silicon substrate 1 is exposed to $O_2$-plasma so that the photoresist is removed.

The silicon nitride film 21 is then processed by the RIE process with the etched silicon oxide film 21 serving as a mask. Successively, the WSi film 18, the polycrystalline silicon film 17, the ONO film 16 and the polycrystalline silicon film 15 are sequentially processed by the RIE process with the silicon nitride film 21 serving as a mask. Thereafter, heat is applied to the silicon substrate 1 in an atmosphere of oxygen at 1000° C. so that a silicon oxide film 19 is formed on the sidewall of the gate electrode 4a.

Subsequently, a double-layer silicon oxide film is deposited and processed by the RIE process so that the silicon oxide film 20 is formed on the sidewall of the gate electrode 4a, as shown in FIGS. 8A and 8B. In this case, as shown in FIG. 8A, the active area 3 of a portion where the contact hole 5 is to be formed later is processed by the RIE process so that a shoulder of a portion of the active area 3 adjacent to the STI 2 is rounded. As a result, a central part of the active area 3 is higher and the ends thereof are lower, whereby the active area 3 is formed into an angular shape. Successively, the silicon nitride film 9 with a film thickness of 20 nm is deposited.

Figure 9B:
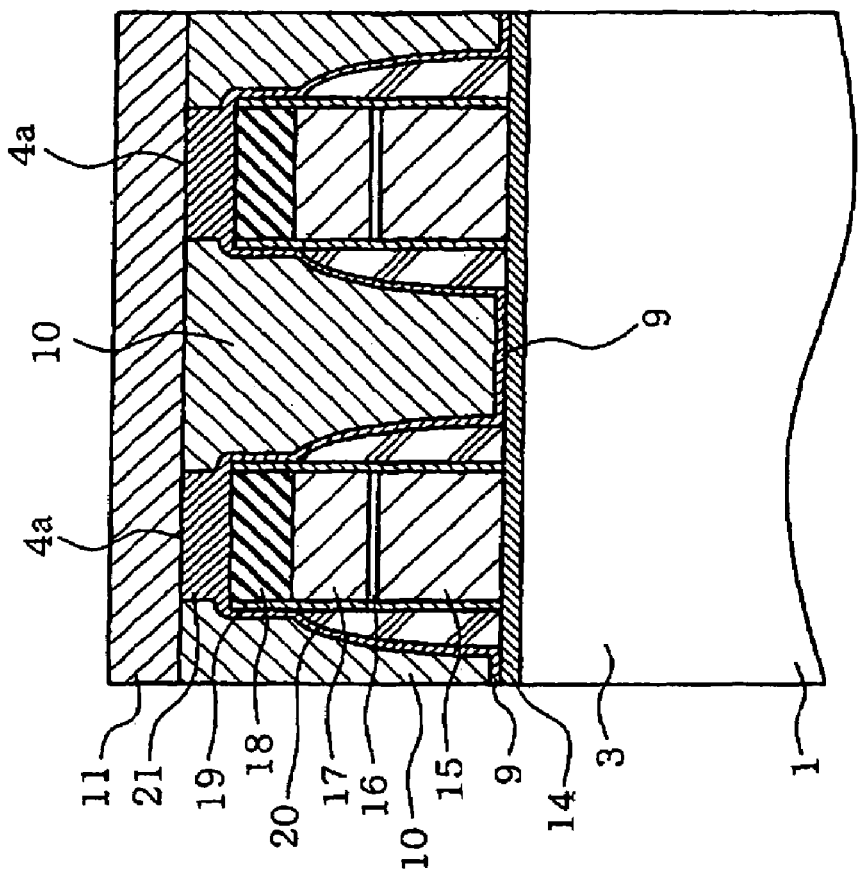
Figure 9A:
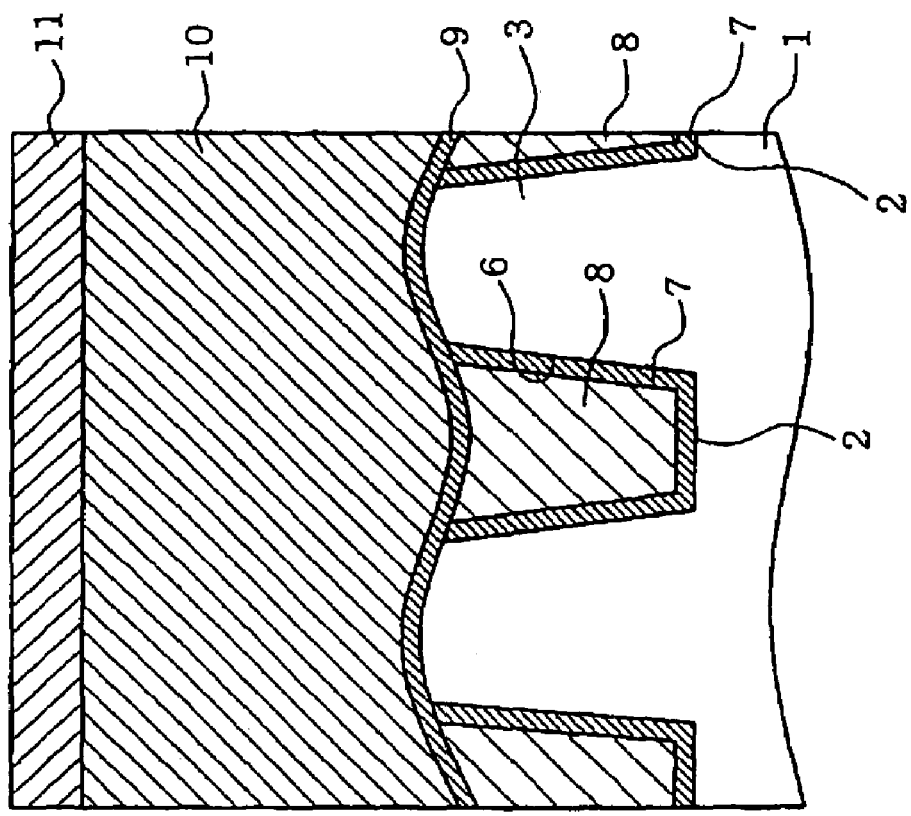

Subsequently, the silicon oxide film 10 is deposited, and hat is applied to the silicon oxide film 10 in an atmosphere of oxygen at 750° C., as shown in FIGS. 9A and 9B. Thereafter, the silicon oxide film 10 is planarized by the CMP process and the silicon oxide film 11 is deposited. Next, as shown in FIGS. 10A and 10B, resist is patterned on a forming pattern of the contact hole 5 by the photolithography process. The silicon oxide films 11 and 10 are processed by the RIE process with the patterned resist serving as a mask. Subsequently, the silicon substrate 1 is exposed to O2-plasma so that the photoresist is removed. Successively, the silicon nitride film 9 and the silicon oxide film 14 are processed by the RIE process.

Subsequently, the barrier metal 12 is formed in the contact area by a sputtering process and then heat-treated in an atmosphere of nitrogen at 550° C. The tungsten 13 is then deposited by the CVD process. The tungsten 13 and the barrier metal 12 are polished by the CMP process, whereupon a flat configuration as shown in FIGS. 1A and 1B is obtained.

The following effects are achieved from the foregoing embodiment. The processing condition of the RIE process is selected so that the surface of the active area 3 to be formed into the contact hole 5 extends from the central portion toward ends of the adjacent STI 2 so as to be convex. As a result, even if a position gap of the pattern should occur in the forming of the contact hole 5, a desired contact area could be ensured between the barrier metal 12 and tungsten plug 13, and the active area 3. Consequently, a reduction in an operating time such as a writing speed onto the memory cell can be prevented. In other words, a process capability can be improved in the formation of the contact hole 5.

The invention should not be limited to the foregoing embodiment. The embodiment may be modified or expanded as follows. The surface of the active layer 3 forming the contact hole 5 should not be limited to the above-described one but may be formed into various shapes in which the surface of the active layer 3 is lowered from the central portion toward the interface between the STI 2 and the active layer 3.

The invention may be applied to NOR flash memories or other memory devices, instead of the NAND flash memory.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:

1. A semiconductor device comprising:
a semiconductor substrate including a plurality of trenches formed along a first direction and a plurality of first upper surfaces divided by the trenches;
a plurality of element isolation insulating films embedded in the respective trenches and including a plurality of second upper surfaces continuous with the first upper surfaces in a second direction which is perpendicular to the first direction, respectively;
a plurality of interlayer insulating films formed above the first and the second upper surfaces; and
a plurality of contact plugs defined in the interlayer insulating films so as to connect with the first upper surfaces of the semiconductor substrate,
wherein each first upper surface is inclined in the second direction so as to be lowered from a central part thereof toward interfaces between said each first upper surface and the second upper surfaces adjacent to said each first upper surface.

2. A semiconductor device comprising:
a semiconductor substrate including a plurality of trenches formed along a first direction and a plurality of first upper surfaces divided by the trenches;
a plurality of element isolation insulating films embedded in the trenches and including a plurality of second upper surfaces continuous with the first upper surfaces in a second direction which is perpendicular to the first direction, respectively;
a plurality of interlayer insulating films formed above the first and the second upper Surfaces; and
a plurality of contact plugs defined in the interlayer insulating films so as to connect with the first upper surfaces of the semiconductor substrate respectively,
wherein each first upper surface is curved in the second direction so that a central part thereof is located higher than interfaces between said each first upper surface and the second upper surfaces adjacent to said each first upper surface.

3. The semiconductor device according to claim 1, wherein the second upper surfaces of the element isolation insulating films include middle portions which are located lower than the interfaces in the second direction, respectively.

4. The semiconductor device according to claim 3, wherein each first upper surface and the second upper surfaces adjacent to said each first upper surface have a conjoined surface including a winding shape.

5. The semiconductor device according to claim 1, further comprising a silicon nitride film located between each interlayer insulating film and the first and second upper surfaces.

6. The semiconductor device according to claim 2, wherein the second upper surfaces of the element isolation insulating films include middle portions which are located lower than the interfaces between the first and the second upper surfaces, respectively.

7. The semiconductor device according to claim 6, wherein each first upper surface and the second upper surfaces adjacent to said each first upper surface have a conjoined surface including a winding shape.

8. The semiconductor device according to claim 2, further comprising a silicon nitride film located between each interlayer insulating film and the first and second upper surfaces.

* * * * *